US009325357B2

(12) United States Patent
Volokhine et al.

(10) Patent No.: US 9,325,357 B2
(45) Date of Patent: Apr. 26, 2016

(54) WIRELESS COMMUNICATION UNIT, INTEGRATED CIRCUITS AND METHOD FOR LINEARIZING A TRANSMITTER SIGNAL

(71) Applicants: Youri Volokhine, Stevensbeek (NL); Jeffrey Kevin Jones, Chandler, AZ (US)

(72) Inventors: Youri Volokhine, Stevensbeek (NL); Jeffrey Kevin Jones, Chandler, AZ (US)

(73) Assignee: FREESCALE SEMICONDUCTOR, INC., Austin, TX (US)

( * ) Notice: Subject to any disclaimer, the term of this patent is extended or adjusted under 35 U.S.C. 154(b) by 0 days.

(21) Appl. No.: 14/469,916

(22) Filed: Aug. 27, 2014

(65) Prior Publication Data

US 2016/0065250 A1  Mar. 3, 2016

(51) Int. Cl.
*H04L 25/49* (2006.01)
*H04L 27/00* (2006.01)
*H04B 1/04* (2006.01)
*H03F 3/195* (2006.01)
*H03F 3/24* (2006.01)
*H03F 1/32* (2006.01)

(52) U.S. Cl.
CPC ............ *H04B 1/0475* (2013.01); *H03F 1/3247* (2013.01); *H03F 3/195* (2013.01); *H03F 3/245* (2013.01); *H03F 2200/129* (2013.01); *H03F 2201/3224* (2013.01); *H04B 2001/0425* (2013.01); *H04B 2001/0433* (2013.01)

(58) Field of Classification Search
USPC ......... 375/219, 220, 221, 222, 229–236, 240, 375/240.26–240.27, 240.29, 295, 296, 297, 375/299, 300, 316, 318, 317, 319, 320, 324, 375/325, 338, 340, 345, 346, 358; 300/75, 300/85, 88, 90, 99
See application file for complete search history.

(56) References Cited

U.S. PATENT DOCUMENTS

| 6,081,161 | A   | * | 6/2000 | Dacus | H03F 1/0211 330/285 |
| 2005/0068102 | A1 | * | 3/2005 | Hongo | H03F 1/3258 330/149 |
| 2007/0098414 | A1 | * | 5/2007 | Zhou | H04B 10/504 398/194 |
| 2012/0154053 | A1 |   | 6/2012 | Blair | |
| 2012/0293253 | A1 | * | 11/2012 | Khlat | H03F 1/0244 330/127 |
| 2013/0207721 | A1 | * | 8/2013 | Mulawski | H03F 1/0222 330/253 |
| 2013/0285743 | A1 | * | 10/2013 | Onishi | H03F 1/0222 330/149 |
| 2015/0194936 | A1 | * | 7/2015 | Inanoglu | H03F 1/0222 330/291 |

OTHER PUBLICATIONS

Zhao, J. et al., "Error Compensation for Digital Predistortion Linearizers" Microwave Journal; Oct. 1, 2007; downloaded from <<http://www.microwavejournal.com/articles/print/5397-error-compensation-for-digital-predistortion-linearizers>>, 9 pages.

* cited by examiner

Primary Examiner — Linda Wong

(57) ABSTRACT

A wireless communication unit comprising a transmitter comprises: a linearization circuit arranged to receive and digitally distort an input signal; a radio frequency power amplifier operably coupled to the linearization circuit and arranged to amplify a radio frequency representation of the digitally distorted input signal; a feedback path arranged to feed back a portion of the amplified digitally distorted output of the received input signal to the linearization circuit; a bypass circuit comprising a plurality of energy storage elements operably coupled between an output of the radio frequency power amplifier and ground; and a first connector arranged to provide a representation of at least one electrical memory effect of at least one of the plurality of energy storage elements to the linearization circuit, wherein the linearization circuit is arranged to use the representation of the at least one electrical memory effect when digitally distorting the input signal.

20 Claims, 7 Drawing Sheets

WIRELESS COMMUNICATION UNIT, INTEGRATED CIRCUITS AND METHOD FOR LINEARIZING A TRANSMITTER SIGNAL

FIELD OF THE INVENTION

The field of this invention relates to a wireless communication unit, integrated circuits comprising a power amplifier or a linearization circuit and a method for linearizing a transmitter signal. The invention is applicable to, but not limited to, a power amplifier for use with a predistortion linearization circuit.

BACKGROUND OF THE INVENTION

A primary focus and application of the present invention is the field of radio frequency (RF) transmitters and power amplifier architectures capable of use in wireless telecommunication applications and particularly related to wide bandwidth, or instantaneous bandwidth (ISBW) signals for example when base stations simultaneously transmit multiple channels. Continuing pressure on the limited spectrum available for radio communication systems is forcing the development of spectrally-efficient linear modulation schemes. Since the envelopes of a number of these linear modulation schemes fluctuate, these result in the average power delivered to the antenna being significantly lower than the maximum power, leading to poor efficiency of the power amplifier. Specifically, in this field, there has been a significant amount of research effort in developing high efficiency topologies capable of providing high performances in the 'back-off' (linear) region of the power amplifier.

Linear modulation schemes require linear amplification of the modulated signal in order to minimise undesired out-of-band emissions from spectral re-growth. However, the active devices used within a typical RF amplifying device are inherently non-linear by nature. Only when a small portion of the consumed DC power is transformed into RF power, can the transfer function of the amplifying device be approximated by a straight line, i.e. as in an ideal linear amplifier case. This mode of operation provides a low efficiency of DC to RF power conversion. To achieve both linearity and efficiency, so called linearization techniques are used to improve the linearity of the more efficient amplifier classes, for example class 'AB', 'B' or 'C' amplifiers. A number and variety of linearizing techniques exist, which are often used in designing linear transmitters, such as Cartesian Feedback, Feedforward, and Adaptive Pre-distortion.

The advent of deep-submicron CMOS has enabled the use of digital predistortion (DPD) techniques capable of compensating for non-linearity. In particular, DPD has enabled analog circuits and devices operating at low-current, with non-linear bias points to be employed. Such techniques are implemented at the cost of additional digital processing, but overall result in a net reduction on current consumption. Digital baseband predistortion circuits are typically located prior to the radio frequency amplifier stage(s) and arranged to compensate for the nonlinearity effects in the final amplifier stage(s), thereby allowing at least the final power amplifier stage to run close to its maximum output power whilst maintaining low spectral regrowth.

FIG. 1 illustrates a known circuit diagram 100, as shown in US2012/0154053 A1, for a power amplifier 110 that illustrates various energy storage elements (such as capacitors and inductors) whose electrical memory' effects would affect the performance of a transmitter, should the power amplifier 110 be used in a DPD architecture. The circuit diagram 100 comprises an input network 120 comprising a pi-type arrangement of capacitors and inductors and an output matching network 130 that includes a blocking capacitor that forms part of a high quality factor radio frequency path of the output matching network 130. A bypass network that comprises a resistance-inductance-capacitance (R-L-C) arrangement 140 is coupled in parallel to the blocking capacitor to raise the resonant frequency of the envelope circuit and to attenuate any low frequency gain peak of a signal passing through the transmitter. The bypass network has a main function to increase the ISBW capability, by lowering the effective inductance seen at envelope frequencies, thereby raising the low-frequency resonance. The bypass capacitor Cbp in the R-L-C arrangement 140 is intended to act as a ground, and as such is a high-value capacitance all the way down to low frequencies.

Use of power amplifier circuits within a DPD architecture cause problems as the DPD algorithms use an initial assumption of the final amplifier stage(s) device(s) behavior, as well as knowledge of the device state in order to improve the final linearity of the PA after DPD correction. One of the challenges when designing DPD architectures is to correct so called 'electrical memory' effects of the circuits, particularly in high frequency, high power applications that employ multiple and various energy storage elements (such as capacitors and inductors). Such electrical memory effects are caused by energy storage elements that have to be charged or discharged, and where the residual charge affects the operational characteristic of the circuit that the energy storage element resides in. Such correction of electrical memory effects is considered to be a computational resource-intensive process.

SUMMARY OF THE INVENTION

The present invention provides a wireless communication unit, a radio frequency integrated circuit, a baseband integrated circuit and a method therefor, as described in the accompanying claims.

Specific embodiments of the invention are set forth in the dependent claims.

These and other aspects of the invention will be apparent from and elucidated with reference to the embodiments described hereinafter.

BRIEF DESCRIPTION OF THE DRAWINGS

Further details, aspects and embodiments of the invention will be described, by way of example only, with reference to the drawings. In the drawings, like reference numbers are used to identify like or functionally similar elements. Elements in the figures are illustrated for simplicity and clarity and have not necessarily been drawn to scale.

DETAILED DESCRIPTION

Because the illustrated embodiments of the present invention may, for the most part, be implemented using electronic components and circuits known to those skilled in the art, details will not be explained in any greater extent than that considered necessary, to understand and appreciate of the underlying concepts of the present invention and in order not to obfuscate or distract from the teachings of the present invention.

Figure 2:
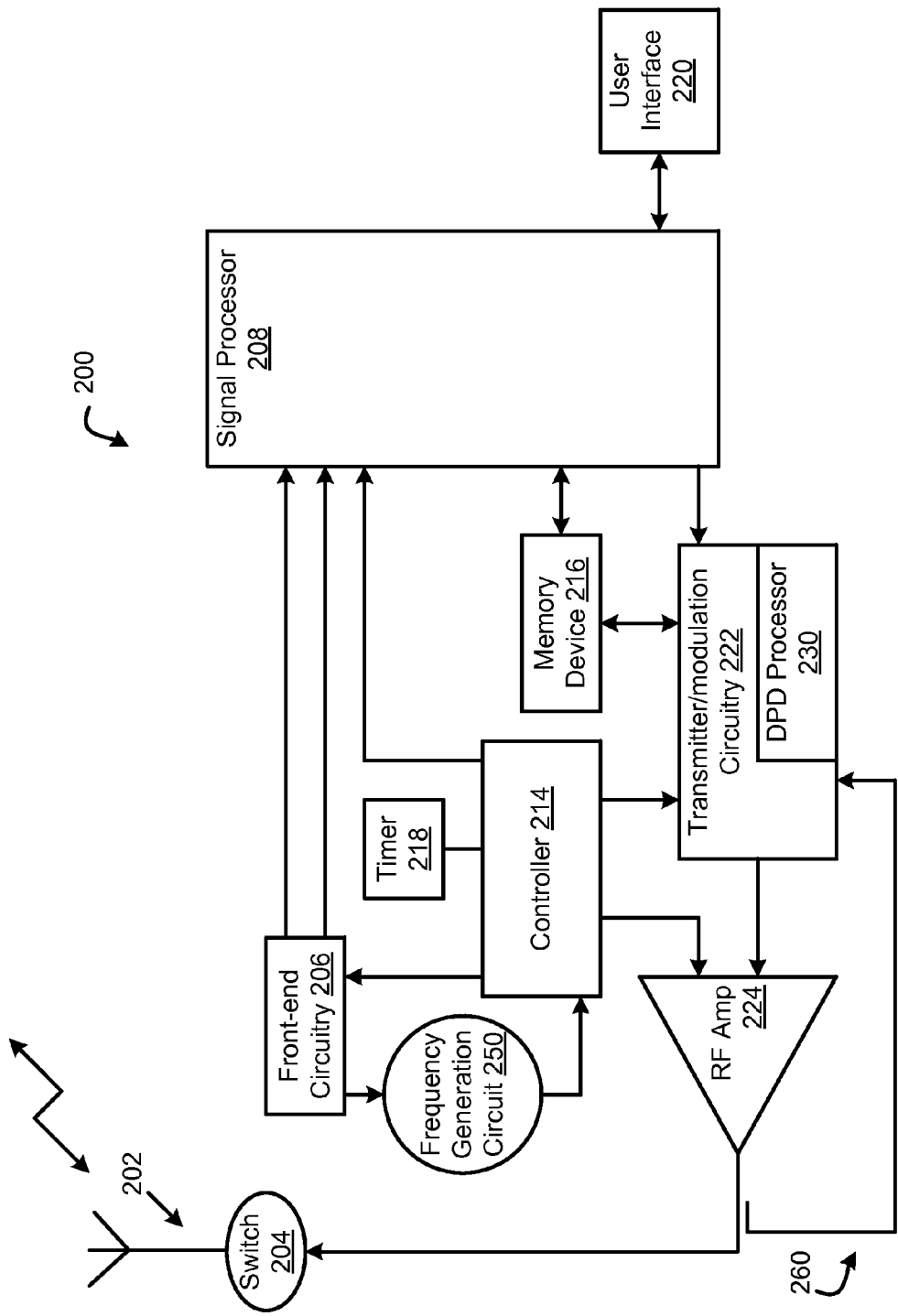
FIG. 2 illustrates an example of a wireless communication unit that is adapted to support example embodiments of the present invention.

Referring first to FIG. 2, a block diagram of a wireless communication unit is shown. The wireless communication unit 200 may for example be an evolved NodeB base station compliant with the long term evolution (LTE™) variant of 3GPP standards. The wireless communication unit 200 comprises an antenna 202 coupled to a duplex filter or antenna switch 204 that provides isolation between receive and transmit chains within the wireless communication unit 200.

The receiver chain, as known in the art, includes receiver front-end circuitry 206 (effectively providing reception, filtering and intermediate or base-band frequency conversion), which is operably coupled to a frequency generation circuit 250 to provide a local oscillator signal for mixing with the received signal in order to produce a base-band representation thereof. The front-end circuitry 206 is coupled to a signal processor 208. An output from the signal processor 208 is provided to an optional suitable user interface 220. A controller 214 maintains overall control and is coupled to the receiver front-end circuitry 206 and the signal processor 208 (generally realised by one or more digital signal processor (DSP)). The signal processor 208 is also coupled to one or more memory device 216 that selectively stores various operating regimes, such as decoding/encoding functions, synchronisation patterns, code sequences, and the like.

As shown, the one or more memory device 216 is arranged to store modulation data, and DPD data for use in pre-distorting signals to be output by the wireless communication unit 200. Furthermore, a timer 218 is operably coupled to the controller 214 to control the timing of operations (transmission or reception of time-dependent signals) within the wireless communication unit 200).

As regards the transmit chain, also referred to as transmitter herein, this comprises in this example, in addition to transmitter/modulation circuitry 222 and an RF power amplifier 224, a user interface 220 coupled in series via signal processor 208 to the transmitter/modulation circuitry 222. The transmitter/modulation circuitry 222 processes input signals for transmission and modulates and up-converts these digital signals to a radio frequency (RF) signal for amplifying in the RF power amplifier module (or integrated circuit) 224. RF signals amplified by the PA module 224 are passed to the antenna 202. The transmitter/modulation circuitry 222 and power amplifier 224 are each operationally responsive to the controller 214.

As shown, for example, with the wireless communication unit supporting a digital predistortion (DPD) architecture, an output signal from the power amplifier 224 is applied to the antenna switch 204 and fed back a portion thereof via path 260 to the transmitter/modulation circuitry 222, which in this example includes a DPD processor 230. In this manner, DPD processor 230 is arranged to determine a digital correction to be applied to the digital input signal that is to be applied to the transmitter/modulation circuitry 222.

As shown, for example current information may be fed back to controller 214 that works in conjunction with DPD processor 230. By lowering a resistance value of a voltage controlled resistor that is used as a dampening resistor in later embodiments, when envelope signals are lower than or above the low frequency resonance, non-linearity from, say, inter-modulation products, may be reduced. The controller 214 may then be arranged to modify the resistor value (for example effect via a voltage-control) to reduces a coefficient complexity in a DPD algorithm performed by DPD processor 230.

As shown in FIG. 2, in some examples, the signal processor function 208 in the transmit chain may be implemented as distinct from the processor in the receive chain, as well as distinct from the DPD processor 230. Alternatively, a single processor may be used to implement processing of both transmit and receive signals, as shown in FIG. 2, and in some examples may also encompass DPD processor 230. Clearly, the various components within the wireless communication unit 200 can be realised in discrete or integrated component form, with an ultimate structure therefore being merely an application-specific or design selection.

Figure 3:
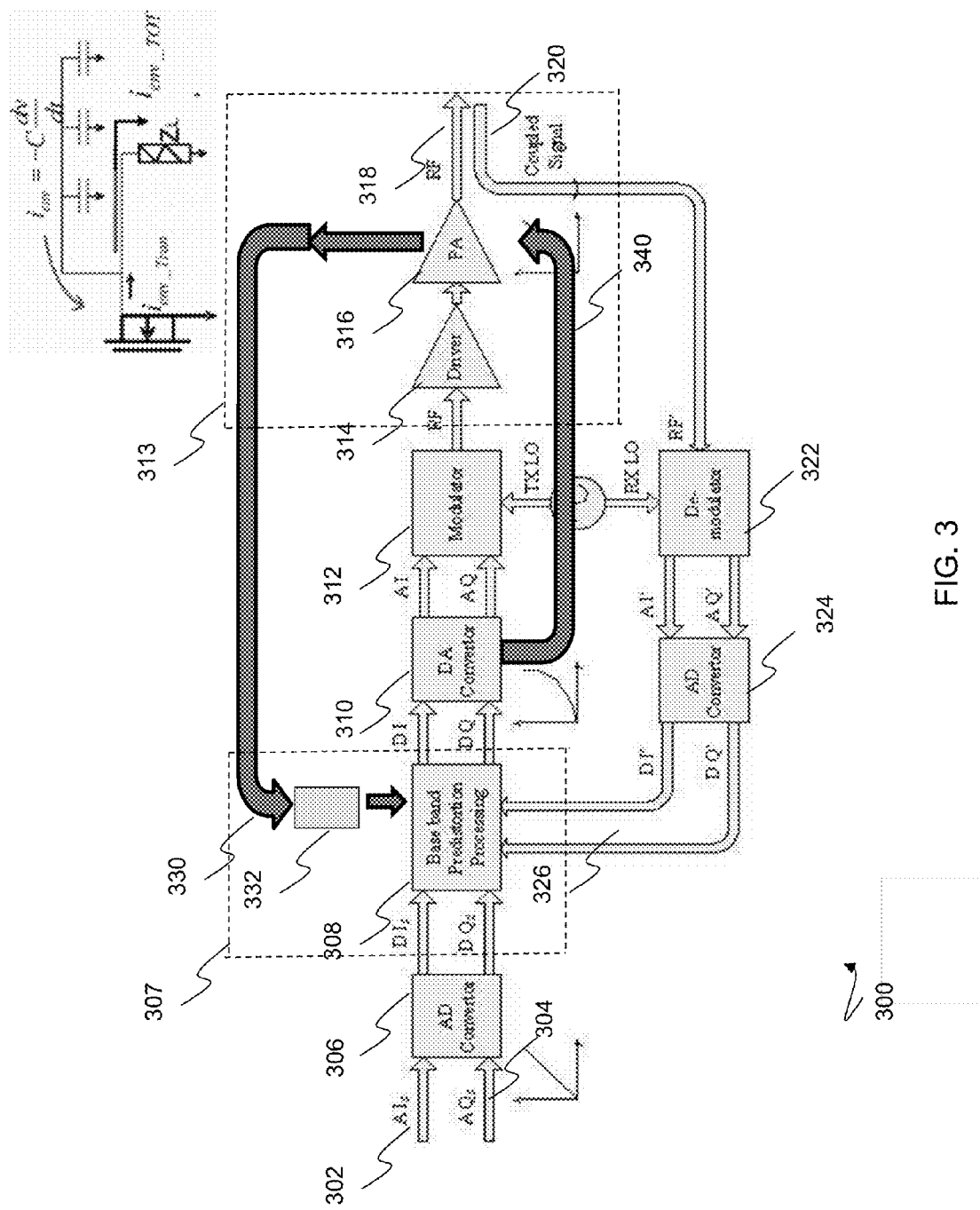
FIG. 3 illustrates an example of a block diagram of a digital predistortion circuit that is adapted to support example embodiments of the present invention.

FIG. 3 illustrates an example block diagram 300 of a part of a transceiver of a wireless communication unit adapted to support digital predistortion (DPD) coefficient estimation/derivation. The transceiver of the wireless communication unit comprises a digital predistortion circuit having a digital quadrature input $A_i$ 302 and $A_q$ 304. The quadrature input $A_i$ 302 and $A_q$ 304 are respectively input to an analog-to-digital convertor (A/D) 306, which converts the analog input signals to a digital form. The digital outputs from the A/D 106 are input to a baseband digital predistortion (DPD) processor 308, arranged to compensate for the nonlinearity effects introduced in the final amplifier stage(s). The digital predistorted output signals from the DPD processor 308 are input to a digital-to-analog convertor (D/A) 310, which converts the digital predistorted signals to an analog form. The analog output signals are input to a modulator 312, often comprising a quadrature frequency up-conversion (often a narrowband mixer) stage, having band-pass filtering (BPF) and amplification, which in combination also introduce non-linearities into signals passing therethrough. The amplification stage is usually a linear driver stage 314 followed by a high-power non-linear RF power amplifier (PA) 316. A portion 320 of the non-linear RF PA output 318 is then extracted and routed to a receiver, for example a demodulator 322, often comprising quadrature frequency down-conversion (often a narrowband mixer) stage, having band-pass filtering (BPF) and amplification in order to identify quadrature analog outputs $A_i$ and $A_q$. The analog outputs $A_i$ and $A_q$ are respectively input to a further A/D 324, which converts the analog input signals to a digital form. The digital outputs from the A/D 324 are input to the baseband DPD processor 308, arranged to compensate for the nonlinearity effects introduced in the final amplifier stage(s). Thus, in order to compensate for the distortion (e.g. nonlinearity effects introduced in the final amplifier stage(s)), pre-distortion is introduced typically into the digital form of the quadrature input $A_i$ 302 and $A_q$ 304.

As shown in FIG. 3, in some examples, the linear driver stage 314 and high-power non-linear RF power amplifier (PA) 316 and coupler to provide a portion 320 of the non-linear RF PA output 318 to a linearization circuit may be formed on a radio frequency integrated circuit 313. In some examples the radio frequency integrated circuit 313 comprises: a radio frequency power amplifier operably coupled to a linearization circuit and arranged to amplify a radio frequency representation of a digitally distorted input signal; a feedback path arranged to feed back a portion of the amplified digitally distorted output of the received input signal to the linearization circuit; a bypass circuit comprising a plurality of energy storage elements operably coupled between an output of the radio frequency power amplifier and ground; and a first connector arranged to provide a representation of one or more electrical memory effect of one or more of the plurality of energy storage elements to the linearization circuit, such that the linearization circuit use the representation of the one or more electrical memory effect when digitally distorting the input signal received by the radio frequency power amplifier. In other examples, as will be appreciated by a skilled artisan, other components may also reside in the radio frequency integrated circuit 313.

DPD algorithms rely on an initial assumption of the final amplifier stage(s) device behavior together with an additional knowledge of the final amplifier stage(s) device state in order to improve the accuracy of the DPD correction and, thus, the final linearity of the PA after DPD correction. One of the challenges is to correct so-called electrical memory effects of energy storage elements associated with or coupled to the final amplifier stage(s) device, which is considered to be a computational resource-intensive process. In examples of the present invention, an additional feedback path 330 is provided that routes memory effect information back to the DPD processor 308 via a further A/D converter 332. Once a determination of the memory effects associated with the active device(s) of the final amplifier stage has/have been made in the DPD processor 308, a control signal 340 may be sent to control one or more components within the radio frequency transmitter circuit, for example to control one or more components (such as inductance and/or capacitance component(s) and/or the variable resistance and/or the bias voltage) to either improve DPD correction for wide bandwidth signals, or to use the memory effect information to reduce the DPD algorithm complexity.

As shown in FIG. 3, in some examples, the DPD processor 308 may reside in a baseband integrated circuit 307 which may be used in a transmitter chain. In some examples, the baseband integrated circuit 307 comprises a linearization circuit arranged to receive an input signal and digitally distort the received input signal to produce a digitally distorted output signal. An input of the baseband IC may be arranged to receive a fed back portion of an amplified digitally distorted representation of the digitally distorted output signal from a power amplifier of the transmitter and a representation of one or more electrical memory effect of one or more of a plurality of energy storage elements located within or operably coupled to the power amplifier. The linearization circuit may be arranged to use the representation of the one or more electrical memory effect when digitally distorting the input signal. In other examples, as will be appreciated by a skilled artisan, other components may also reside in the baseband integrated circuit 307.

Figure 4:
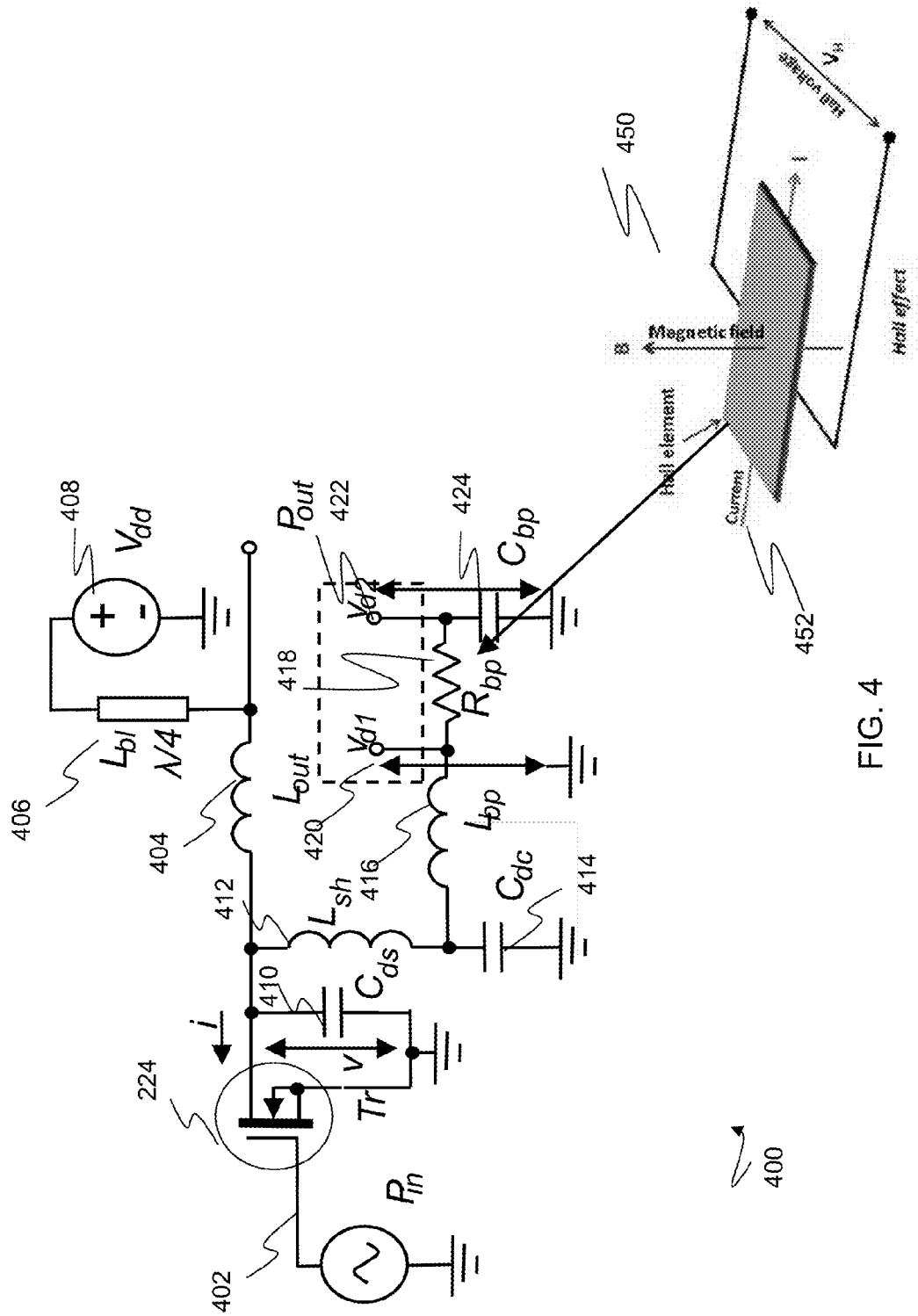
FIG. 4 illustrates an example of a power amplifier circuit employing a Hall effect element to provide envelope current information (amplitude and direction) for the digital predistortion circuit of FIG. 3 and/or the wireless communication unit of FIG. 2.

Referring to FIG. 4, an example of a simplified schematic of a high power amplifier with added ports for memory effects detection is illustrated. An input signal 402 is provided to (active) high-power (and As shown, for example, non-linear) RF PA 224, which has a parasitic output inductance (Lout ~0.1 nH) 404 and an inductance bias line 406 coupled to a supply (Vdd) 408 and represented by an inductance (Lbl of a few nH). An output matching network comprises an output parasitic capacitance 410 (Cds of tens of pF), a shunt inductance (Lsh of ~0.1 nH for a 2 GHz application) 412 to compensate for Cds, a DC blocking capacitor (Cdc of ~300 pF) 414, an internal bypass inductance (Lbp of ~0.5 nH) 416.

In the shown example, a first side of a dampening bypass resistor (Rbp in the order of a few Ohms) 418 is operably coupled to the internal bypass inductance (Lbp of ~0.5 nH) 416. As shown, an envelope decoupling capacitor ($C_{ENV}$ of ~tens of nF) 416 can also operably coupled to a second side of the dampening bypass resistor 418. The introduction of dampening bypass resistor 418 has an effect of dampening the resonance at low frequencies. Bringing the envelope decoupling capacitor ($C_{ENV}$) inside an integrated circuit package to limit the inductance may create an issue with a low frequency resonance around, say, 10-20 MHz. This is because the envelope decoupling capacitor ($C_{ENV}$) needs to be small physically to fit in the IC package, but still needs to be large enough handle the DC signal and the envelope voltage. These two constraints limit the capacitance value, so at such low frequencies, the envelope decoupling capacitor ($C_{ENV}$) is no longer representative of a ground.

As shown, for example, a first connector 420 and a second connector 422 are connected to either side of the dampening bypass resistor 418 and arranged to detect a level of the envelope current passing there through.

As shown, for example, a first voltage (vd1) is measured at the first connector 420, effectively providing a measured voltage at dampening resistor Rbp 418, and a second voltage (vd2) is measured at the second connector 422, effectively providing a measured voltage at the envelope decoupling capacitor ($C_{ENV}$) 424. As shown, for example, first connector 420 (providing a measure of vd1) and second connector 422 (providing a measure of vd2) are connected to additional leads of an integrated circuit package comprising the PA 224 and are accessible at the PCB. vd2 is used to measure energy stored in envelope decoupling capacitor ($C_{ENV}$) 424. The current flowing in internal bypass inductance (Lbp) 416 is measured as a voltage drop across dampening resistor Rbp 418 as: (vd1-vd2)/Rbp.

For instance, the measure of the level of the envelope current passing there through provides electrical memory status information about energy storage elements Lbp 416 and envelope decoupling capacitor ($C_{ENV}$) 424. In addition, an averaging of the measured envelope current provides the information about any energy change in Lbl 406, for example where the envelope decoupling capacitor ($C_{ENV}$) may be located on the PCB, for example coupled to a bias lead. In some examples, the sensing may be performed at that location.

In some examples, the electrical memory effect(s) of a number of components in a radio frequency application are determined and corrected for. In particular, an envelope decoupling capacitor ($C_{ENV}$) may be placed in electrical proximity of an active device (e.g. an RF PA). In the example of FIG. 4, for instance, the envelope decoupling capacitor ($C_{ENV}$) is placed in electrical proximity of the active device (noting that an inductance of a connection between the internal video decoupling capacitor is likely less than an inductance associated with bias lines). In this respect, the term 'electrical proximity' implies that the envelope decoupling capacitor ($C_{ENV}$) operates as an RF and envelope frequency ground that reduces the inductance in the envelope circuit.

Placing the envelope decoupling capacitor ($C_{ENV}$) in electrical proximity of the active device may be considered as adding a current sensor (for instance in a Hall effect current sensor manner) into, say, an envelope-based transmitter architecture that comprises, at least a radio frequency power amplifier. In some examples, such a current sensor may provide information about a direction of envelope current flow passing through the active device as well as an absolute value of video/envelope current. The sensor reading may be used to approximate an electrical memory effect of the active device and matching/decoupling circuits, and can be used to create coefficients for a DPD correction algorithm to improve linearity with memory correction.

As shown in FIG. 4, in some examples, any additional electrical memory effect introduced by the envelope decoupling capacitor ($C_{ENV}$) itself may be masked by incorporating a dampening resistor 418 into the circuit. In some examples, the current sensor (e.g. Hall effect sensor) may be placed under the dampening resistor, to facilitate easy current sensing. Additionally, in some examples, by using a voltage controlled resistor as the dampening resistor 418, the control of memory effects can be achieved in addition to compensation performed by a direct DPD algorithm. In some examples, the voltage controlled resistor may be implemented using two clamped FETs, to enable current flow in both directions. In some examples, an adjustable dampening resistor 418 may be used to improve an electrical memory behavior of the active device, (e.g. the high power RF PA) by means of a control signal to a digital front end (DFE) integrated circuit or architecture.

In some examples, the reading of such sensor may be performed via, say, additional sensing pins of the integrated circuit package. In some examples, a reading of the direction of the envelope current (Ienv) and its value may provide sufficient information to estimate an electrical memory effect of the active device. In some examples, the estimated electrical memory effect of the device may be used as part of a DPD algorithm.

Figure 5:
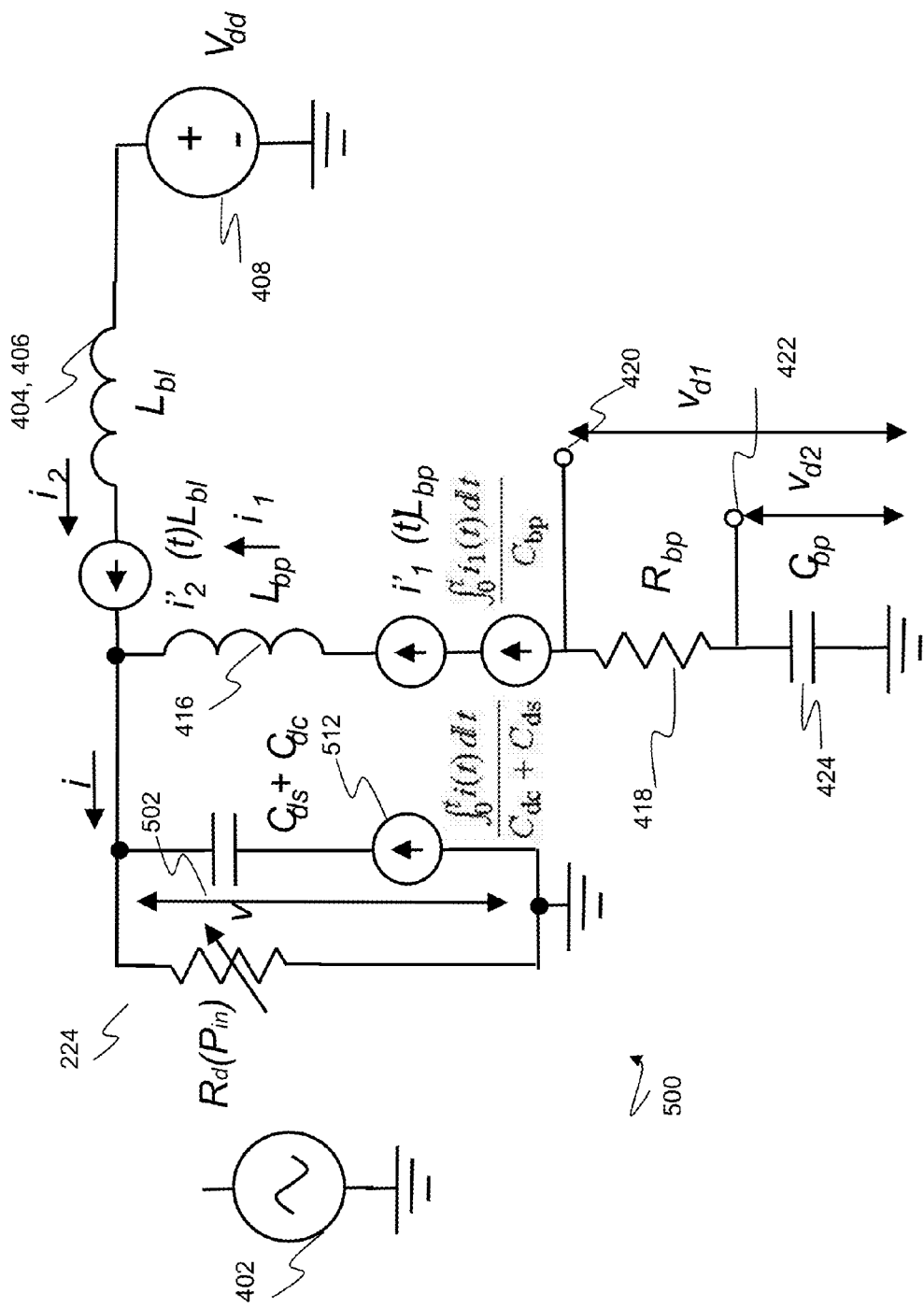
FIG. 5 illustrates a power amplifier simulation circuit representation of FIG. 4.

Referring to FIG. 5, an example of a computational schematic that illustrates how a change in electrical memory effects, measured between first connector 420 (measuring vd1) and second connector 422 (measuring vd2), and based on a change in input power 402, may be tracked. The computational schematic in FIG. 5 is similar to that shown and described with respect to FIG. 4, and therefore similar features and functions of circuit components will not be repeated for simplicity.

In the example of FIG. 5, the final stage power amplifier 224 is illustrated as a Rd(Pin) transistor with a variable resistor (Rd) that varies as a function of input power (Pin). For instance, with a 200W power amplifier, the variable resistor Rd will effectively exhibit a change of resistance from 2 Ohm at peak power to 8 Ohm in a 'back-off' mode. In this example, it is noteworthy that such a change could induce transient processes at bypass frequencies. This is because the power consuming variable resistor Rd is separated from the DC source 408 by inductance(s) 404, 406 (Lbl) and by bypass inductance (Lbp) 416 from the internal source of energy, e.g., envelope decoupling capacitor ($C_{ENV}$) 424. Such a transient energy transfer may lead to a modified voltage (v) 502 at the current source 512, e.g., at the drain of transistor 224. The change in the modified voltage (v) 502 as a function of input power (Pin) 402 relates to the electrical memory effect of energy storage elements in (or coupled to) the active device (namely the PA 424).

The variable (internal) resistance Rd of PA 424 at DC can be computed as a function of supply voltage (Vdd) 408, power added efficiency (PAE), Gain of the transistor ($G_T$), and input power ($P_{in}$) 402, as illustrated in equation [1]:

$$R_d = \frac{PAE V_{dd}^2}{(G_T - 1)P_{in}} \qquad [1]$$

In this example, PAE and $G_T$, as functions of Pin, are typically known from a data sheet/specification of the PA 424, or they can be measured. Of particular note is that the peak RF power, and subsequently generated AM-AM and AM-PM characteristics of the PA 424, are generally proportional to $Vdd^2$. Thus, after a proper characterization of the PA, such dependencies are also known. Therefore, in response to a change of modified voltage (v) 502 at the current source 512, predicted based on a known change of the variable resistance Rd as a function of Pin, then the determined modified voltage (v) 502 can be corrected by the DPD (not shown) without requiring in some examples intensive computational effort. Additionally and/or alternatively, such a solution can be implemented in order to compensate for electrical memory effects via a control signal, for example via control path 380 of FIG. 3.

The major sources of energy that cannot follow any instantaneous change of variable resistance Rd include:

magnetic energy (e.g. $0.5*L_{bl}*i_2^2$) stored in internal bypass inductance (Lbp) 404, 406, energy (e.g. $0.5*L_{bp}*i_1^2$) stored in bypass inductor (Lbp) 416, and energy (e.g. $0.5 C_{ENV}*V_{d2}^2$) stored in envelope decoupling capacitor ($C_{ENV}$) 424.

During any change of Rd, these sources induce voltage modification v at the drain of PA 424. In order to predict the modification of 'v' of the energy stored of these elements must be known at the moment of Rd change. Thus, the initial conditions, namely current for inductance and voltage across the capacitor, are computed by measuring vd1 and vd2, and the electrical memory effects of these energy storage elements may be compensated for.

As before with the circuit representation of FIG. 4, first connector 420 (measuring vd1) and second connector 420 (measuring vd2) may be connected to additional leads of an integrated circuit package, and may thus be accessible at a PCB level. A determination of a voltage drop across the first connector 420 (measuring vd1) and second connector 420 (measuring vd2) (e.g., vd1-vd2) provides information about current flowing in bypass inductor (Lbp) 416. Furthermore, a measure second connector 420 (measuring vd2) provides information about the energy stored in envelope decoupling capacitor ($C_{ENV}$) 424.

Figure 6:
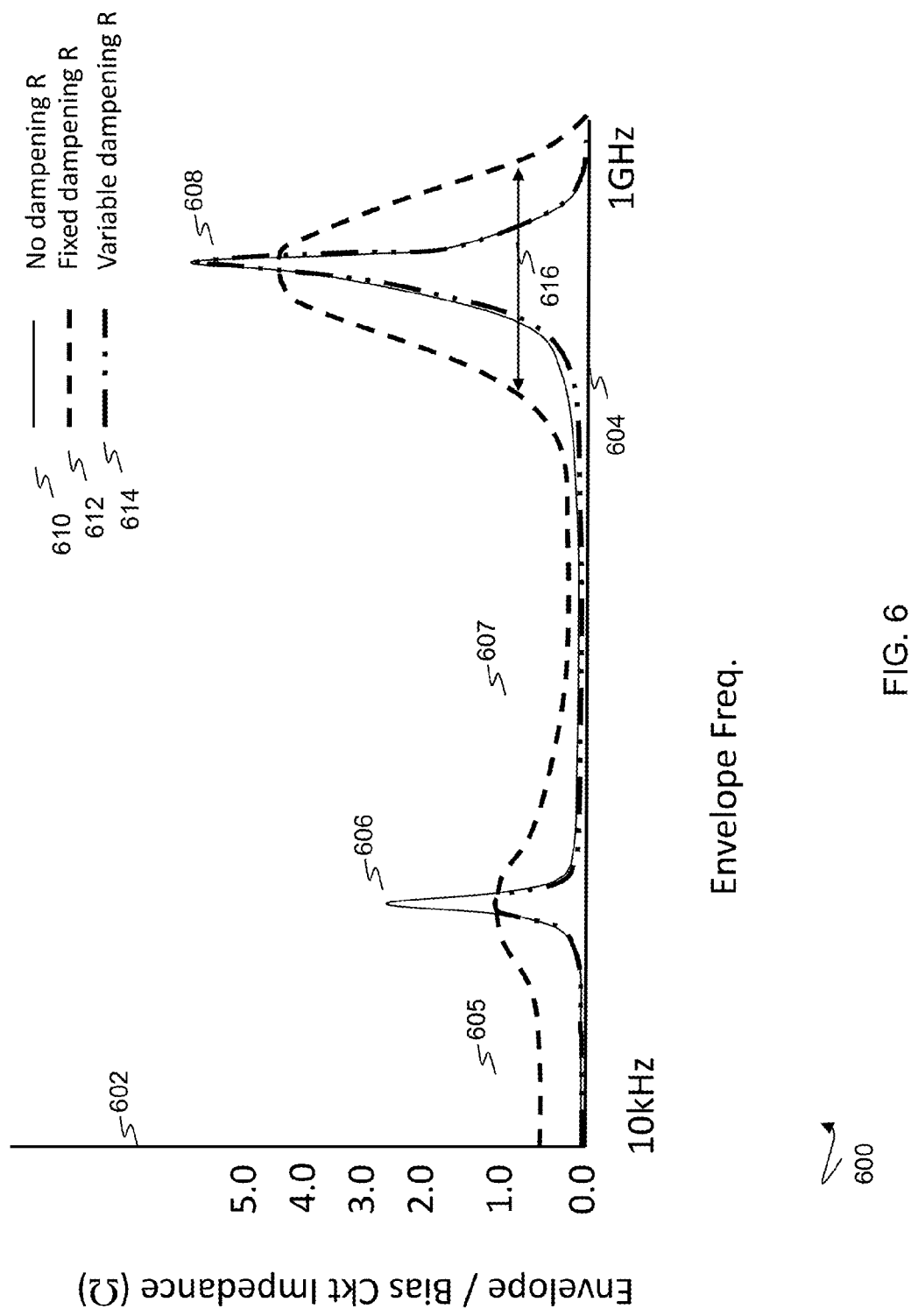
FIG. 6 illustrates a graphical example of when an envelope/bias impedance goes above a value that creates significant memory effects.

Referring now to FIG. 6, a graphical example 600 illustrates when an envelope/bias impedance transitions above a value that creates significant memory effects. Graphical example 600 illustrates impedance 602 versus frequency 604 for various applications of the voltage controlled resistor used as a dampening resistor in previous examples.

A first arrangement 610 that employs no dampening is illustrated by a fixed line and shows approximately a 0 ohm impedance at low envelope frequencies, greater than 2.5 ohm at the self-resonant frequency of the envelope decoupling capacitor, and greater than 6 ohm impedance at the low frequency resonance of the entire envelope/bias circuit. A second arrangement 612 that employs a fixed dampening resistance is illustrated by a dotted line and shows approximately a higher impedance of 0.5 ohm at low envelope frequency, an improved impedance of no greater than 1 ohm at the self-resonant frequency of the envelope decoupling capacitor, and a dampened impedance of roughly 4 ohms at the low-frequency resonance of the entire envelope bias circuit, thereby creating an undesirable wider range of frequencies 616 where the impedance is greater than 1 ohm.

As illustrated by a variable dashed/dotted line in the third arrangement 614 that employs variable dampening, it may be possible to improve the envelope/bias circuit impedance so that it stays below a critical value (for instance 1 ohm) over a wider spectrum of envelope frequencies. This is particularly beneficial when signals are transmitted with wide instantaneous bandwidth (ISBW), but with frequency gaps between transmit frequencies.

Thus, in some examples, by using a voltage controlled resistor as the dampening resistor, it may be possible to raise the resistance value of the voltage controlled resistor when envelope signals are present close to the low-frequency resonance 606, and lower the resistance value of the voltage controlled resistor when envelope signals fall either lower than 605, or above 607, the low frequency resonance 606. In this example, the term 'close' encompasses where the envelope/bias impedance goes above a value that creates minimal memory effects, for instance 1 ohm. By lowering the resistance value when envelope signals are lower than or above the low frequency resonance, non-linearity from, say, intermodulation products, may be reduced. Here, the current information may be fed back to a controller, for example controller 214 of FIG. 2 that works in conjunction with a DPD processor such as DPD processor 230 of FIG. 2. The controller 214 can then be arranged to modify the resistor value (for example effect a voltage-control) that reduces the coefficient complexity in the DPD algorithms.

Figure 7:
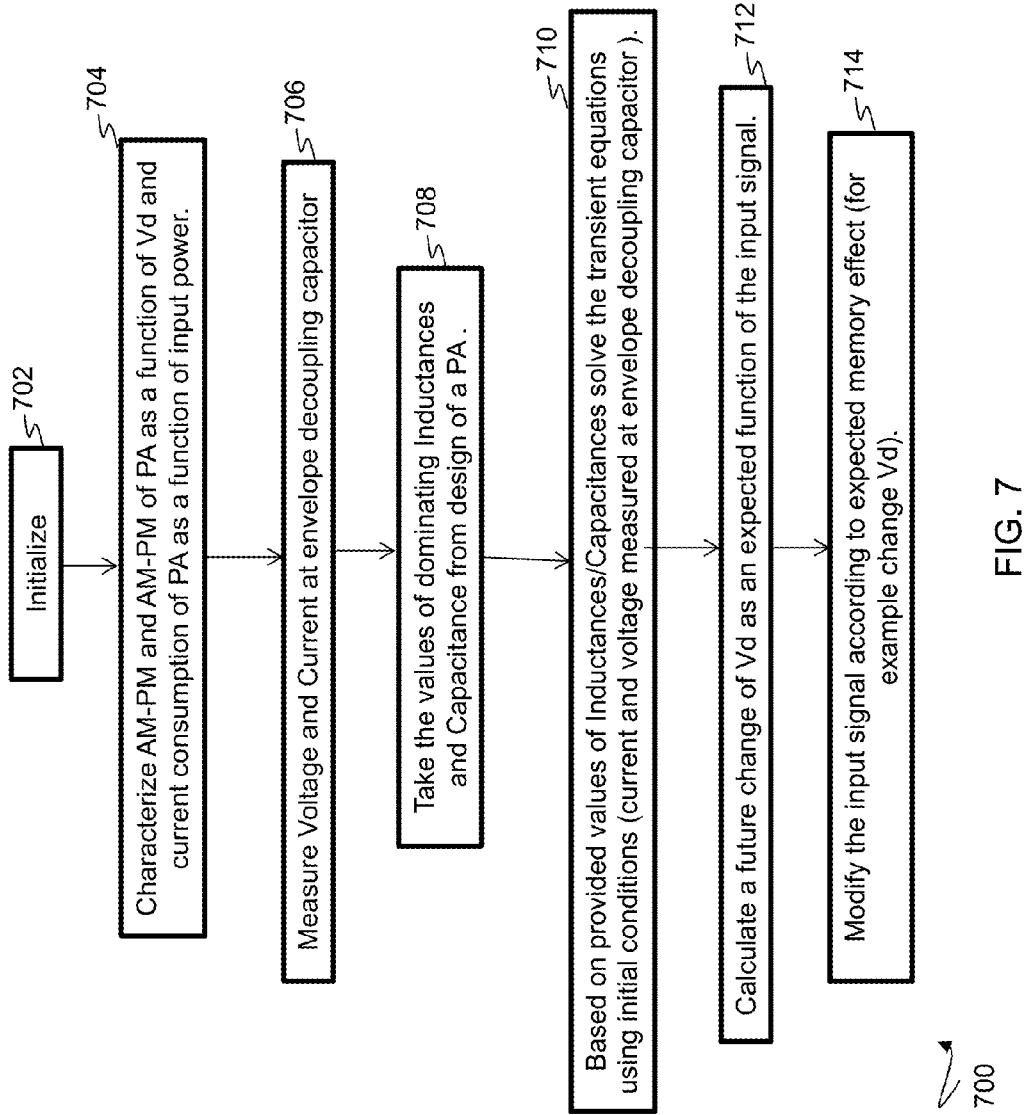
FIG. 7 illustrates an example flow chart of a power amplifier circuit employing a Hall effect element to provide envelope current information for the digital predistortion circuit.

Referring to FIG. 7, an example flow chart 700 of a power amplifier circuit employing a Hall effect element, such as the power amplifier circuit of any of FIGS. 2 to 5, in order to provide electrical memory effects for the digital predistortion circuit, is described. The flow chart 700 commences with an initializing of the transmitter, as illustrated in 702. After initializing of the transmitter, the PA (and/or other non-linear devices in the transmitter) may be characterized, e.g. by determining amplitude modulated-to-amplitude modulated (AM-AM) and/or amplitude modulated-to-phase modulated (AM-PM) effects of the PA as a function of the supply voltage (Vd). In addition, a current consumption of the PA as a function of an input power level, may be determined, as illustrated in 704. Following characterization, the voltage and current are measured, for example across the dampening resistor and at the envelope decoupling capacitor ($C_{ENV}$), as illustrated in 706. In some examples, the values of any dominating inductance(s) and/or capacitance(s) from a design sheet of the PA may also be extracted, as illustrated in 708. Thereafter, based on the extracted (or provided) values of any dominating inductance(s) and/or capacitance(s), and the determined initial conditions of energy storage elements (for example determined by the current and voltage measured across the dampening resistor and at the envelope decoupling capacitor ($C_{ENV}$) in 706), a signal processor (such as baseband predistortion processor 308 from FIG. 3), may be arranged to solve the transient equations (for example, V=Ldi/dt, I=CdV/dt, . . . ) as illustrated in 710. Following the signal processor solving the transient equations in 710, the signal processor is arranged to calculate a future change of Vd as an expected function of input. Thereafter, the signal processor may modify the baseband input signal, for example in baseband predistortion processor 308, according to the expected memory effect (due, say, to a Vd change), as illustrated in 712. In this manner, the initial memory conditions for dominating inductance(s) and/or capacitance(s) in a PA design may be taken into account, for example when applied to a transmitter's predistortion-based architecture.

Thus, in some examples a method for linearizing a transmitter signal is described. The method comprises, at the transmitter: receiving and digitally distorting an input signal; amplifying a radio frequency representation of the digitally distorted input signal; feeding back a portion of the amplified digitally distorted output of the received input signal to a linearization circuit; determining one or more electrical memory effect of one or more of a plurality of energy storage elements located within or operably coupled to a power amplifier of the transmitter; providing the representation to the linearization circuit; and using, by the linearization circuit, the representation of the one or more electrical memory effect when digitally distorting the input signal.

In some examples, some or all parts of the method may be performed by hardware and/or some or all in software. In some examples, the aforementioned may be performed in a different order than shown in FIG. 7, whilst providing the same or similar benefits.

In the foregoing specification, the invention has been explained with reference to specific examples of embodiments of the invention. It will, however, be evident that various modifications and changes may be made therein without departing from the scope of the invention as set forth in the appended claims and that the claims are not limited to the specific examples described above.

For example, it will be apparent that although the unit shown in FIG. 2 comprises both a receiver chain and a transmit chain, the unit may likewise not have a receiver chain. Likewise, although the unit shown in FIG. 2 comprises an antenna, the unit may be connected to an external antenna instead.

Furthermore, it will be apparent that examples of the aforementioned inventive concept may be applied by a semiconductor manufacturer to any predistortion circuit or integrated circuit comprising a predistorter for an RF PA. It is further envisaged that, for example, a semiconductor manufacturer may employ the inventive concept in a design of a stand-alone device, such as a predistorter module, or application-specific integrated circuit (ASIC) and/or any other sub-system element. Alternatively, the examples of the invention may be embodied in discrete circuits or combination of components. In some examples, the aforementioned circuits may be employed in integrated circuits based on laterally-diffused metal oxide semiconductors (LDMOS) or Gallium Arsenide (GaN).

Figure 1:
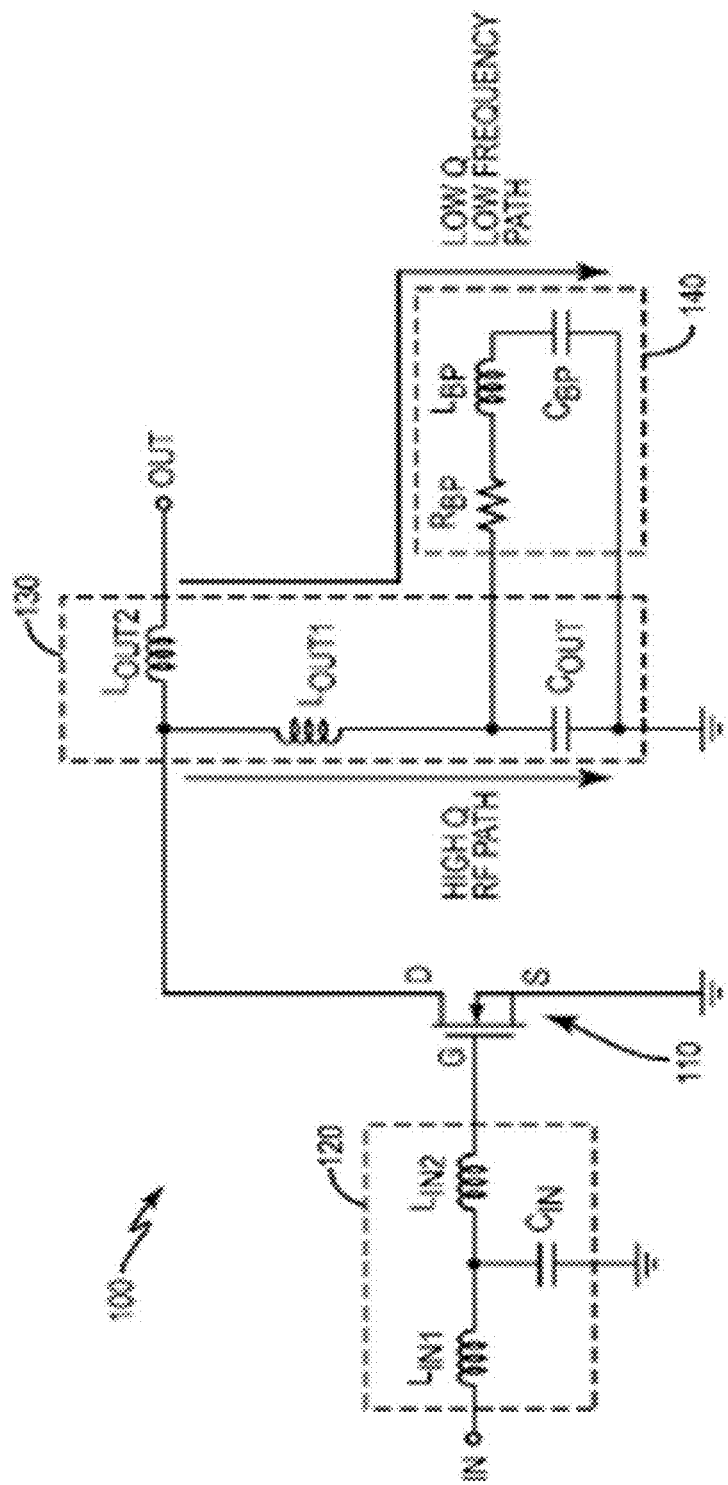
FIG. 1 illustrates a circuit diagram of a known power amplifier circuit.

Furthermore, it will be appreciated by a skilled artisan that the inventive concept herein described may be embodied in any type of circuit with an active device that is connected to a number of energy storage elements for example a predistortion circuit with a high power RF PA. Accordingly, the power amplifier may be part of any suitable power amplifier circuit, and may be subject to effects from its printed circuit board (PCB), as well as any electrical memory effect(s) of any internal components of devices used within the power amplifier circuit. In some examples, determining the electrical memory effect(s) may comprise determining currents in, for example, dominating inductors (such as PCB bias line, internal inductor connecting a drain port to a decoupling capacitor, etc.). In some examples, determining the electrical memory effect(s) may comprise determining any voltage(s) that affect electrical memory effect(s), such as a voltage across a decoupling capacitor. By monitoring voltage at the envelope decoupling capacitor ($C_{ENV}$), as well as current between an RF cold point (for example RF energy is seeing a ground such as at Cout in FIG. 1) and the envelope decoupling capacitor ($C_{ENV}$), it is possible to monitor the electrical memory effect of the device and if necessary to correct it. Here, the envelope circuit appears as a high impedance at radio frequencies so that radio frequency signals do not flow into the envelope circuit, but it is seen as a low impedance to the envelope frequencies.

Furthermore, although examples of the invention have been described with respect to correcting electrical memory effects of a high power RF PA in a pre-distortion circuit architecture, such as a 300W RF PA of a base station, it is envisaged that examples of the invention may be implemented with any amplifier stage, including non-linear drivers, as well as any feedback Linearization technique of any wireless communication unit, including a mobile wireless communication unit (sometimes referred to as a mobile subscriber unit (MS) in the context of cellular communications or an user equipment (UE) in terms of a $3^{rd}$ generation partnership project (3GPP™)).

The connections as discussed herein may be any type of connection suitable to transfer signals from or to the respective nodes, units or devices, for example via intermediate devices. Accordingly, unless implied or stated otherwise, the connections may for example be direct connections or indirect connections. The connections may be illustrated or described in reference to being a single connection, a plurality of connections, unidirectional connections, or bidirectional connections. However, different embodiments may vary the implementation of the connections. For example, separate unidirectional connections may be used rather than bidirectional connections and vice versa. Also, plurality of connections may be replaced with a single connection that transfers multiple signals serially or in a time multiplexed manner. Likewise, single connections carrying multiple signals may be separated out into various different connections carrying subsets of these signals. Therefore, many options exist for transferring signals.

Although specific conductivity types or polarity of potentials have been described in the examples, it will be appreciated that conductivity types and polarities of potentials may be reversed.

Those skilled in the art will recognize that the boundaries between logic blocks are merely illustrative and that alternative embodiments may merge logic blocks or circuit elements or impose an alternate decomposition of functionality upon various logic blocks or circuit elements. Thus, it is to be understood that the architectures depicted herein are merely exemplary, and that in fact many other architectures can be implemented which achieve the same functionality.

Any arrangement of components to achieve the same functionality is effectively 'associated' such that the desired functionality is achieved. Hence, any two components herein combined to achieve a particular functionality can be seen as 'associated with' each other such that the desired functionality is achieved, irrespective of architectures or intermediary components. Likewise, any two components so associated can also be viewed as being 'operably connected,' or 'operably coupled,' to each other to achieve the desired functionality.

Furthermore, those skilled in the art will recognize that boundaries between the above described operations merely illustrative. The multiple operations may be combined into a single operation, a single operation may be distributed in additional operations and operations may be executed at least partially overlapping in time. Moreover, alternative embodiments may include multiple instances of a particular operation, and the order of operations may be altered in various other embodiments.

Also for example, in an embodiment, the illustrated examples may be implemented as circuitry located on a single integrated circuit or within a same device. Alternatively, the examples may be implemented as any number of separate integrated circuits or separate devices interconnected with each other in a suitable manner.

Also for example, the examples, or portions thereof, may implemented as soft or code representations of physical circuitry or of logical representations convertible into physical circuitry, such as in a hardware description language of any appropriate type.

However, other modifications, variations and alternatives are also possible. The specifications and drawings are, accordingly, to be regarded in an illustrative rather than in a restrictive sense.

In the claims, any reference signs placed between parentheses shall not be construed as limiting the claim. The word 'comprising' does not exclude the presence of other elements or steps then those listed in a claim. Furthermore, the terms 'a' or 'an,' as used herein, are defined as one or more than one. Also, the use of introductory phrases such as 'at least one' and 'one or more' in the claims should not be construed to imply that the introduction of another claim element by the indefinite articles 'a' or 'an' limits any particular claim containing such introduced claim element to inventions containing only one such element, even when the same claim includes the introductory phrases 'one or more' or 'at least one' and indefinite articles such as 'a' or 'an.' The same holds true for the use of definite articles. Unless stated otherwise, terms such as 'first' and 'second' are used to arbitrarily distinguish between the elements such terms describe. Thus, these terms are not necessarily intended to indicate temporal or other prioritization of such elements. The mere fact that certain measures are recited in mutually different claims does not indicate that a combination of these measures cannot be used to advantage.

The invention claimed is:

1. A wireless communication unit, comprising:
    a transmit chain for providing an RF signal to an antenna, the transmit chain comprising:
    a linearization circuit arranged to receive and digitally distort an input signal;
    a radio frequency power amplifier operably coupled to the linearization circuit and arranged to amplify a radio frequency representation of the digitally distorted input signal and output at an radio frequency power amplifier output the RF signal to the antenna;
    a feedback path arranged to feed back a portion of the amplified digitally distorted output of the received input signal to the linearization circuit;
    a bypass circuit comprising a plurality of energy storage elements operably coupled between an output of the radio frequency power amplifier and ground; and
    a first connector arranged to provide a representation of at least one electrical memory effect of the at least one of the plurality of energy storage elements to the linearization circuit, wherein the linearization circuit is arranged to use the representation of the at least one electrical memory effect when digitally distorting the input signal.

2. The wireless communication unit of claim 1, wherein the plurality of energy storage elements comprise at least one from a group of: a bypass inductor, an envelope decoupling capacitor.

3. The wireless communication unit of claim 2, further comprising a dampening resistor located between the bypass inductor and the envelope decoupling capacitor and arranged to mask the at least one of the electrical memory effect of the decoupling capacitance.

4. The wireless communication unit of claim 3, wherein the dampening resistor is a voltage controlled variable resistor.

5. The wireless communication unit of claim 4, wherein the voltage controlled variable resistor is operably coupled to a processor arranged to increase a resistance value of the voltage controlled variable resistor when an input envelope signal is present close to a low-frequency resonance value of at least one of the plurality of energy storage elements.

6. The wireless communication unit of claim 4, wherein the voltage controlled variable resistor is implemented in a digital front end.

7. The wireless communication unit of claim 3, further comprising a current sensor operably coupled to the dampening resistor and the linearization circuit and arranged to determine a current passing through the at least one of the plurality of energy storage elements.

8. The wireless communication unit of claim 7, wherein the current sensor is a hall-effect current sensor located atop or below the dampening resistor.

9. The wireless communication unit of claim 7, wherein the current sensor is arranged to determine a value and a direction of an envelope current flowing through at least one of the plurality of energy storage elements.

10. The wireless communication unit of claim 9, wherein the current sensor comprises two clamped field effect transistors arranged to enable current to flow in both directions.

11. The wireless communication unit of claim 1, wherein the linearization circuit is a digital predistortion circuit arranged to distort the input signal according to the at least one electrical memory effect of the at least one of the plurality of energy storage elements located in or coupled to the power amplifier.

12. The wireless communication unit of claim 1, wherein the bypass circuit forms part of the power amplifier such that the linearization circuit is arranged to use the representation of the electrical memory effect when digitally distorting the input signal taking into account electrical memory effects from within the power amplifier.

13. A radio frequency integrated circuit, comprising:
a radio frequency power amplifier operably coupled to a linearization circuit and arranged to amplify a radio frequency representation of a digitally distorted input signal;
a feedback path arranged to feed back a portion of the amplified digitally distorted output of the received input signal to the linearization circuit;
a bypass circuit comprising a plurality of energy storage elements operably coupled between an output of the radio frequency power amplifier and ground; and
a first connector arranged to provide a representation of at least one electrical memory effect of at least one of the plurality of energy storage elements to the linearization circuit, such that the linearization circuit uses the representation of the at least one electrical memory effect when digitally distorting the input signal received by the radio frequency power amplifier.

14. A baseband integrated circuit for a transmit chain, comprising:
a linearization circuit arranged to receive an input signal and digitally distort the received input signal to produce a digitally distorted output signal;
an input arranged to receive:
a fed back portion of an amplified digitally distorted representation of the digitally distorted output signal from a power amplifier of the transmitter; and
a representation of at least one electrical memory effect of at least one of a plurality of energy storage elements located within a bypass circuit located between an output of the power amplifier and ground;
wherein the linearization circuit is arranged to use the representation of the at least one electrical memory effect when digitally distorting the input signal.

15. A method for linearizing a transmitter signal, the method comprising:
receiving at a transmitter an input signal and digitally distorting the input signal;
amplifying a radio frequency representation of the digitally distorted input signal;
feeding back a portion of the amplified digitally distorted output of the received input signal to a linearization circuit;
determining at least one electrical memory effect of at least one of a plurality of energy storage elements located within transmitter bypass circuit located between an output of a power amplifier and ground;
providing a representation of the at least one electrical memory effect of the at least one of the plurality of energy storage elements to the linearization circuit; and
using, by the linearization circuit, the representation of the at least one electrical memory effect of the at least one of the plurality of energy storage elements when digitally distorting the input signal.

16. The wireless communication unit of claim 5, wherein the voltage controlled variable resistor is implemented in a digital front end.

17. The wireless communication unit of claim 4, further comprising a current sensor operably coupled to the dampening resistor and the linearization circuit and arranged to determine a current passing through at least one of the plurality of energy storage elements.

18. The wireless communication unit of claim 5, further comprising a current sensor operably coupled to the dampening resistor and the linearization circuit and arranged to determine a current passing through the at least one of the plurality of energy storage elements.

19. The wireless communication unit of claim 6, further comprising a current sensor operably coupled to the dampening resistor and the linearization circuit and arranged to determine a current passing through the at least one of the plurality of energy storage elements.

20. The wireless communication unit of claim 8, wherein the current sensor is arranged to determine a value and a direction of an envelope current flowing through the at least one of the plurality of energy storage elements.

* * * * *